United States Patent [19]
Atsumi et al.

[11] Patent Number: 6,160,738
[45] Date of Patent: Dec. 12, 2000

[54] NONVOLATILE SEMICONDUCTOR MEMORY SYSTEM

[75] Inventors: Shigeru Atsumi, Tokyo; Hironori Banba; Masao Kuriyama, both of Kanagawa-ken, all of Japan

[73] Assignee: Kabushiki Kaisha Toshiba, Kawasaki, Japan

[21] Appl. No.: 08/181,404

[22] Filed: Jan. 13, 1994

[30] Foreign Application Priority Data

Jan. 13, 1993 [JP] Japan ................................. 5-004303

[51] Int. Cl.[7] .................................................. G11C 16/06
[52] U.S. Cl. ................................ 365/185.25; 365/185.11
[58] Field of Search .................................. 365/185, 900, 365/222, 230.03, 218, 185.25, 185.11

[56] References Cited

U.S. PATENT DOCUMENTS

| 5,197,026 | 3/1993 | Butler | 365/222 X |
| 5,239,505 | 8/1993 | Fazio et al. | 365/222 X |
| 5,283,885 | 2/1994 | Hollerbauer | 365/222 X |

*Primary Examiner*—A. Zarabian
*Attorney, Agent, or Firm*—Banner & Witcoff, Ltd.

[57] ABSTRACT

A nonvolatile semiconductor memory system is provided with a nonvolatile memory cell array divided into erase blocks data and refresh blocks, and a flag cell array including a plurality of nonvolatile flag cells each of which corresponds to one of the refresh blocks and stores data representing the refresh status of the corresponding refresh block.

48 Claims, 14 Drawing Sheets

|  | PROGRAM | ERASE | READ |
|---|---|---|---|
| CONTROL GATE | 10 V | -10 V | 5 V |
| DRAIN | 5 V | OPEN | 1 V |
| SOURCE | 0 V | 5 V | 0 V |

FIG. 13
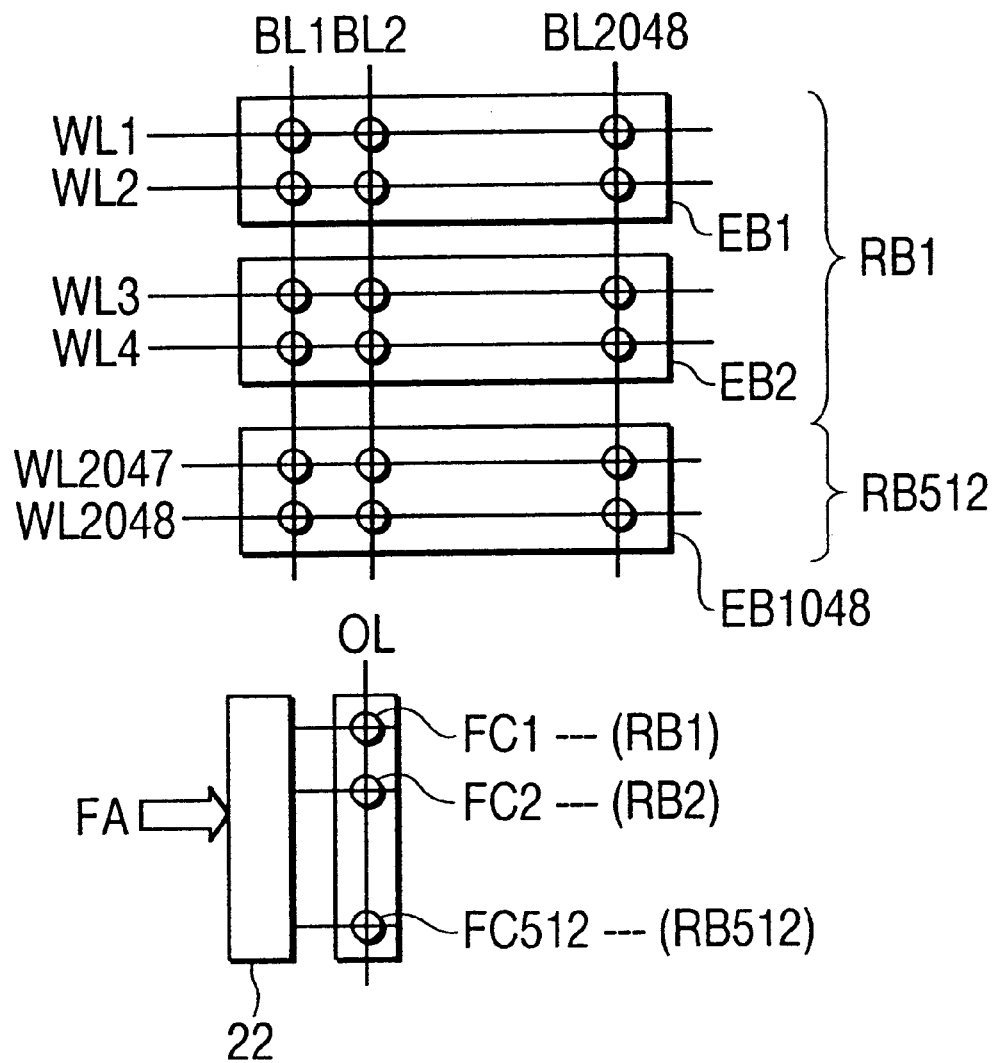
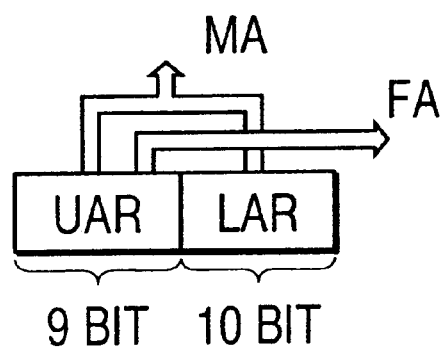

FIG. 15
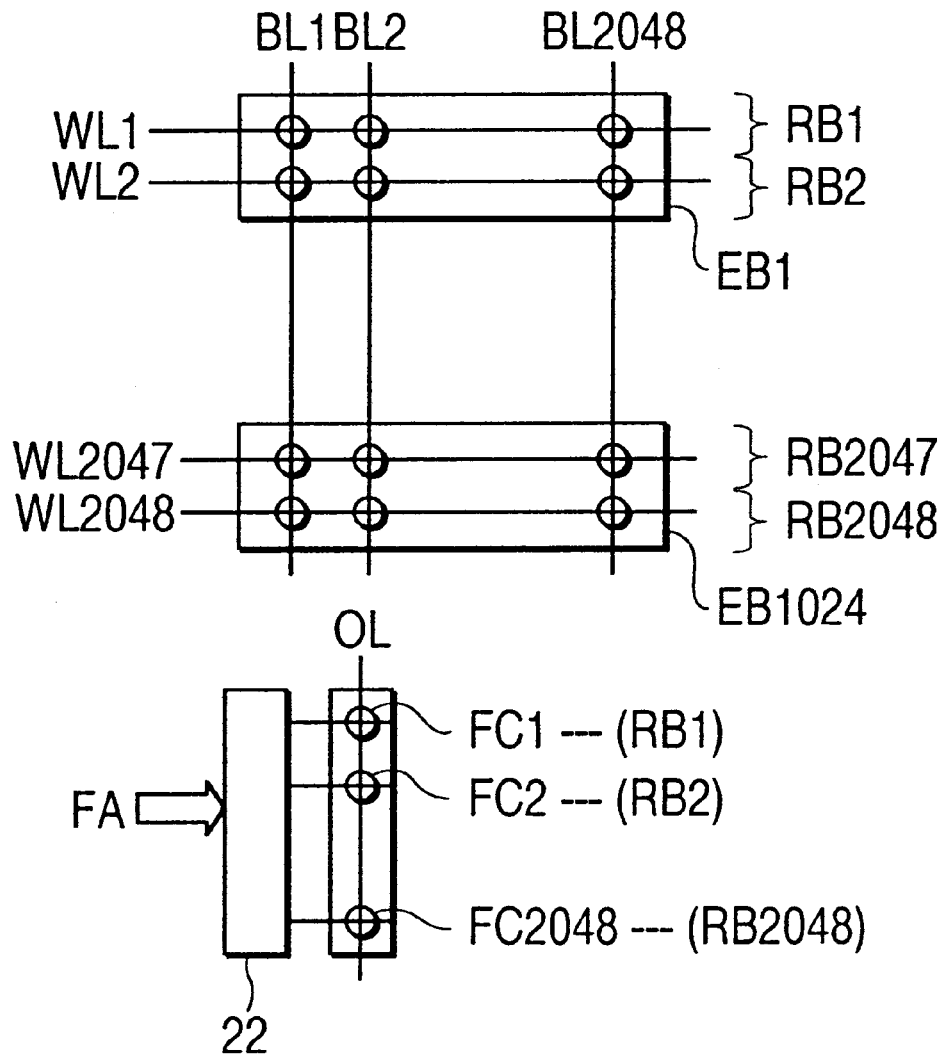
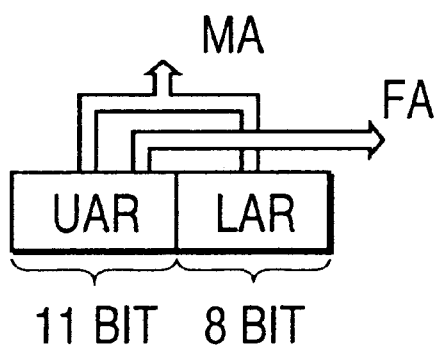

NONVOLATILE SEMICONDUCTOR MEMORY SYSTEM

BACKGROUND OF THE INVENTION

1. Field of the Invention

The present invention generally relates to a nonvolatile semiconductor memory system and, more particularly, to a nonvolatile semiconductor memory system having a nonvolatile memory cell array which is divided into erase blocks.

2. Description of Related Art

In a conventional nonvolatile semiconductor memory device having memory cells each including a floating gate and a control gate, a phenomenon called "drain disturbance" poses a serious problem. Drain disturbance is an unintentional gradual loss or disappearance of data programmed into the memory cell floating gate caused by a tunneling current between the drain electrode and the floating gate due to a high electrical field between the drain electrode and the floating gate.

For example, assume two floating-gate type memory cell transistors have their drain electrodes connected via a bit line. To program data to the first memory cell transistor, a high voltage of about 10V is applied to the control gate electrode of the first memory cell transistor and a voltage of about 5V is applied to the drain electrode of the first memory cell transistor. This condition is maintained for a relatively long period of time, for example 10 $\mu$s, causing hot electrons to be charged into the floating gate of the first memory cell transistor. During this programming of the first memory cell transistor, the control gate electrode of the second memory cell transistor is applied with 0V, and the drain electrode of the second memory cell transistor is applied with 5V via the bit line. A drain stress due to the potential difference between the drain electrode and the floating gate of the second memory cell transistor causes a tunneling current between the drain electrode and the floating gate of the second memory cell transistor. Such tunneling current causes disappearance of data programmed into the floating gate of the second memory cell transistor. This is drain disturbance. Drain disturbance poses a serious problem when a great number of memory cell transistors are connected via a common bit line because the duration of time that a single memory cell suffers from drain stress is multiplied by the number of memory cell transistors sharing the common bit line.

Typically, the problems of drain disturbance in memory devices are overcome by optimization of cell design. However, some nonvolatile semiconductor memory devices include memory cell arrays which are divided into erase blocks (see, for example, "Symposium on VLSI Technology," pp. 77–78, 1991). In such memories, memory cells in one erase block are programmed/erased independently from memory cells in other erase blocks. Thus, the duration of drain stress to one particular memory cell may be extremely long. This drain stress becomes most severe when the data of the memory cells in one erase block is not updated and the data of the memory cells in other erase blocks is frequently programmed and erased. In this case, the duration of drain stress one memory cell may suffer is further multiplied by the number of programming/erasing cycles specified by the manufacturer, for example 100,000. Thus, drain disturbance in a nonvolatile memory device having a memory cell array divided into erase blocks poses a serious problem that has not yet been overcome by optimization of cell design.

SUMMARY OF THE INVENTION

Accordingly, it is an object of the present invention to provide a nonvolatile semiconductor memory device capable of protecting data from drain disturbance caused when the memory cell array is divided into erase blocks.

To attain the above object, there is provided a nonvolatile semiconductor memory system including a nonvolatile memory cell array having a plurality of nonvolatile memory cells arranged in matrix, the nonvolatile memory cell array being divided into N erase blocks and M refresh blocks, and a flag cell array including a plurality of nonvolatile flag cells each of which correspond to one of said refresh blocks and which stores data representing the refresh status of the corresponding refresh block.

The present invention allows data to be recovered which would normally be lost due to drain disturbance during erasing and programming operations. This is accomplished by refreshing one of a plurality of refresh blocks during each successive erasing operation. The one refresh block is selected during each successive erasing operation according to the data stored in the flag cell array. Each flag cell of the flag cell array corresponds to a refresh block. The data value stored in the flag cell represents the refresh status of the corresponding refresh block. A flag cell having a first binary data value represents that the corresponding refresh block has yet to be refreshed. A flag cell having a second binary data value represents that the corresponding refresh block has been refreshed. During each erasing operation, the flag cells are scanned to determine the refresh status of the corresponding refresh blocks. When a particular flag cell having the first binary data value is found, the refresh operation is performed on a refresh block corresponding to the particular flag cell. After the refresh operation of the refresh block is complete, the flag cell array is updated to designate this status.

Because the flag cells are of a nonvolatile type, the refresh block to which the next refresh operation is to be performed can be stored even though power is shut down. Furthermore, because the flag cells are arranged in a manner which corresponds with the refresh blocks, a concentration of programming/erasing operations on each of the flag cells is avoided, thereby limiting the effect of drain disturbance on the flag cell array.

BRIEF DESCRIPTION OF THE DRAWINGS

FIG. 13 is a circuit diagram of an arrangement of a nonvolatile semiconductor memory device according to a second embodiment of the present invention.

FIG. 15 is a circuit diagram of an arrangement of a nonvolatile semiconductor memory device according to a fourth embodiment of the present invention.

DETAILED DESCRIPTION OF THE PREFERRED EMBODIMENTS

Commonly assigned, copending U.S. application Ser. No. 08/077,390, incorporated herein by reference, discloses a portion of the nonvolatile semiconductor memory device described below with respect to FIGS. 1–6.

Figure 1:
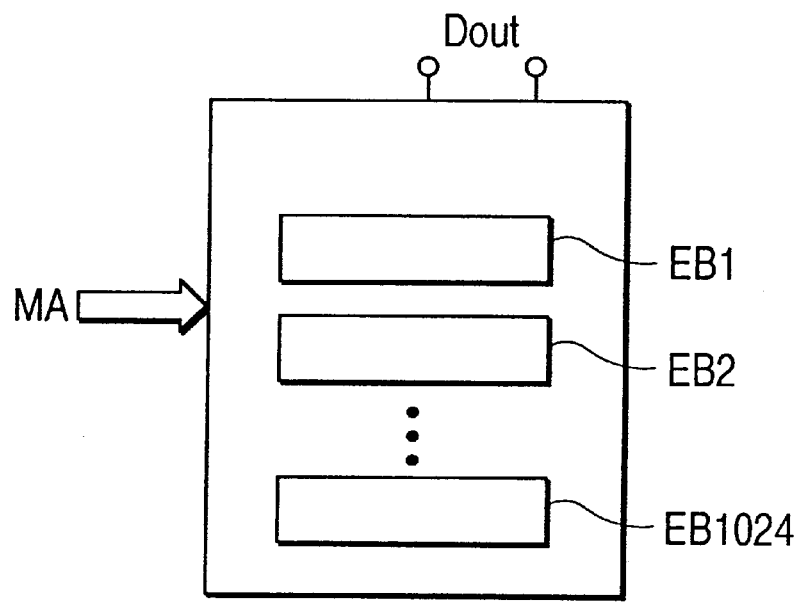
FIG. 1 is a block diagram of a semiconductor memory device.

A nonvolatile semiconductor memory device having a memory cell array divided into erase blocks is shown in FIG. 1. The device includes a 4M-bit memory cell array having nonvolatile memory cells arranged in 2048 rows and 2048 columns and erase blocks EB1, EB2, . . . EB1024 each formed with two word lines and a plurality of memory cells. A particular erase block is selected according to the upper 10 bits of a 19-bit address signal MA, and 8 memory cells within the particular block are specified according to the lower 9 bits thereof. While each of the memory cells of each erase block can be programmed independently, all of the memory cells of each erase block are erased at once. The device is accessed, and data is output therefrom through terminals Dout.

Figure 2:
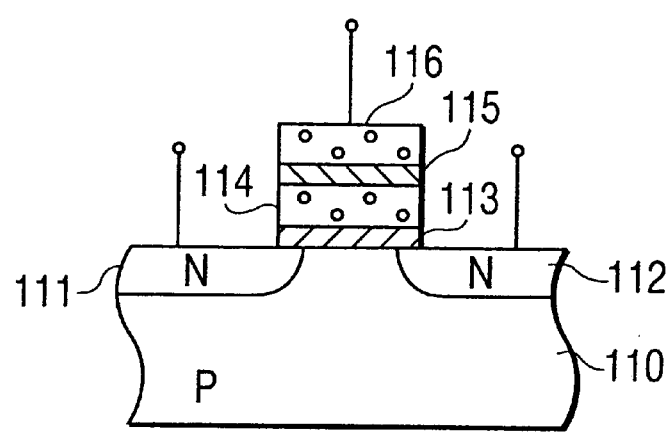
FIG. 2 is a cross-sectional view of a nonvolatile memory cell for use in the semiconductor memory device of FIG. 1.

FIG. 2 shows the structure of a stacked-gate type memory cell utilized in the nonvolatile semiconductor memory device of FIG. 1. More specifically, the stacked-gate type memory cell includes a P-type semiconductor substrate 110, source and drain regions 111 and 112 formed on the surface of the substrate 110, a gate oxide film 113 formed on the substrate 110, a floating gate 114 of polysilicon formed on the gate oxide film 113, a gate oxide film 115 formed on the floating gate 114, and a control gate 116 of polysilicon formed on the gate oxide film 115. The impurity density of the source region and the drain region is the same in order to make the erase operation faster.

Figures 3, 4:
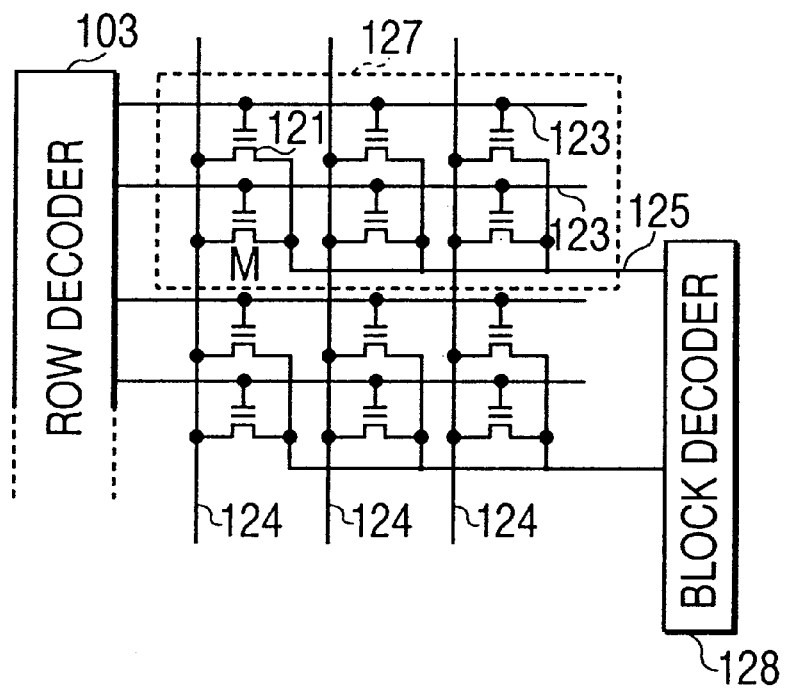
FIG. 3 is a table showing operation voltage conditions of the memory cell of FIG. 2.
FIG. 4 illustrates an erase block of the semiconductor memory device of FIG. 1.

The programming, erasing, and reading operations of the memory cell of FIG. 2 are performed by applying voltages to the control gate 116, the source region 111, and the drain region 112 as shown in FIG. 3. In the programming operation, voltages of 10V, 5V, and 0V are applied to the control gate 116, the drain region 112, and the source region 111, respectively. Thus, some of the electrons which are accelerated by an electric field between the drain and source regions 112 and 111 are injected into the floating gate 114 due to the voltage applied to the control gate 116. The electrons injected into the floating gate 114 are not easily discharged but are fixed to represent a stored datum in accordance with the threshold value of the MOS transistor. The threshold voltage representing an erased state, that is, a state before a programmed state, is about 2V. The erase state generally represents a data value of logic "1". In the above programming operation, the threshold voltage increases to about 6V. The programmed state generally represents a data value of logic "0".

The erasing operation of the memory cell is performed by applying voltages of −10V and 5V to control gate 116 and a source region 111, respectively, and by setting drain region 112 open. Thus, the electrons stored in the floating gate are extracted to the source region side. When the erasing operation is completed, the threshold voltage decreases from about 6V to about 2V.

The reading operation of the memory cell is performed by applying voltages of 5V, 1V, and 0V to control gate 116, drain region 112, and source region 111, respectively. In accordance with these voltages, current will flow through the memory cells storing logical "1" data, but no current flows through memory cells storing logical "0" data. Detection of data read during this reading operation is effected by comparing the memory cell current with a current flowing through a dummy cell (not shown).

FIG. 4 shows an erase block of the nonvolatile semiconductor memory device of FIG. 1 in detail. Parallel word lines 123 are arranged to extend in a first direction (horizontally in FIG. 4), and parallel bit lines are arranged to extend in a second direction (vertically in FIG. 4). The word and bit lines cross each other and stacked memory cells 121 are formed at the crossing points. The drain of each memory cell 121 is connected to a corresponding one of the bit lines 124, and the control gate of each memory cell is connected to a corresponding one of the word lines 123. Word lines 123 are selected by a row decoder 103, and bit lines 124 are selected by a column decoder (not shown). Since the nonvolatile semiconductor memory device is of an 8-bit parallel output (X8) type, the column decoder selects eight bit lines from the 2048 bit lines of the array and connects them to a readout sense amplifier. As described above, the nonvolatile semiconductor memory device includes erase blocks each formed of the memory cells connected to two adjacent word lines. The sources of all memory cells included in each block are connected together to a common source line 125. The common source line 125 is selected by a block decoder 128.

Figure 5:
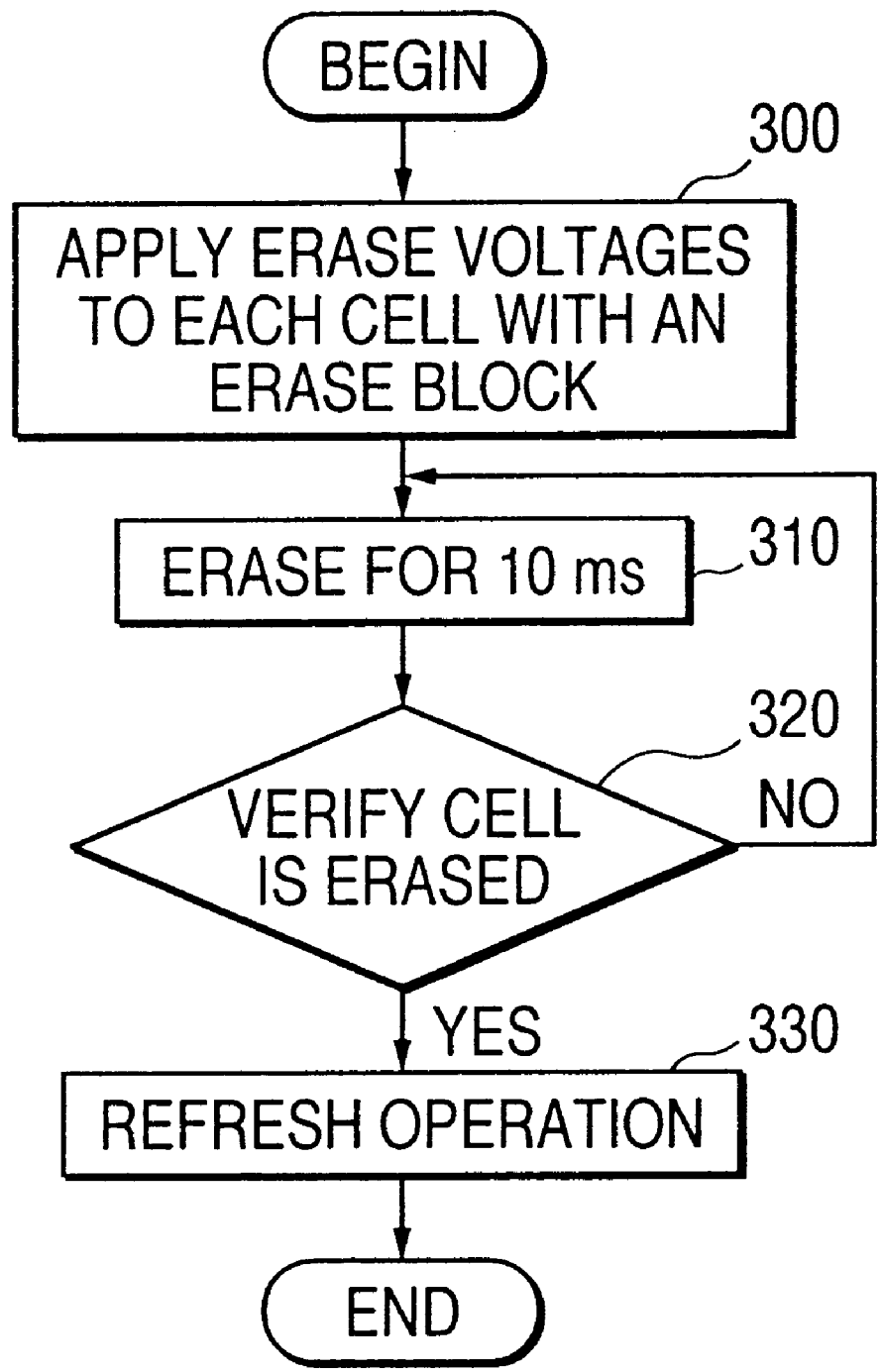
FIG. 5 is a flow chart of an erase operation.

An erasing operation of the nonvolatile semiconductor memory device will now be described, with reference to FIG. 5. This erasing operation is a so-called intelligent erasing operation which frequently verifies and erases data to prevent the data from being over-erased. The nonvolatile semiconductor memory device performs a refresh operation which is performed after the erasing operation is finished. First logical "0" data is written to all memory cells of an erase block. In this case, the logical "0" data can be written only to memory cells having logical "1" data, or the logical "0" data can be written to all memory cells, irrespective of the data which has been previously written thereto. The latter technique is effective when the threshold value is increased. Next an address Ad in the block is set to 0, an erasing operation is continued for 10 ms, and a verifying operation is performed in which it is confirmed whether the data is erased. If the data is not erased, the erasing operation is performed again. If the erasing operation is normally performed, the internal address is incremented, and the verifying operation is continued. After the verifying operation is completed with respect to the addresses in all the block, the refresh operation is started.

The refresh operation is an operation for reading data out of a memory cell and programming it thereto again. Unlike the refresh operation of a DRAM, the readout operation is not destructive and need not be performed in a short period of time such as 180 ms. In the refresh operation, a predetermined address is input, data of a memory cell corresponding to the input address is read out, and the same data is written back to the memory cell. This control can be executed automatically inside a chip or by, for example, a memory system controller outside a chip. When the device is connected to a computer, the control can be executed by an operating system of the computer.

In the refresh operation, an address is input so as to select one of the erase blocks for each refresh operation. In the nonvolatile semiconductor memory device of FIG. 1, an erase block EB is constituted by two word lines and 4096 memory cells. Since the memory cells are selected in groups of 8 bits, the reading and writing operations have to be performed only 512 times. For example, as an address varies from 0000H to 01FFH, data from the corresponding memory cells is read out outside a chip and then stored. Subsequently, the same data is rewritten to memory cells which correspond to addresses 0000H to 01FFH. Thus, the refresh operation of erase block EB1 is performed. The erasing operation need not be performed after the programming operation because the refresh operation is intended to enhance the programmed state. If the refresh operation of an erase block is performed following the erasing operation, it is possible to prevent the gradual loss or destruction of data due to the drain disturbance of memory cells in the erase block. The refresh operation is performed for all the erase blocks. Therefore, when the next erasing operation is performed, the refresh operation of the second erase block EB2 is performed. For example, as an address varies from 0200H to 03FFH, data is read out and written back to memory cells corresponding to these addresses. Thus, the memory system controller, the operating system or the like has to store data regarding which erase blocks have been refreshed. After a refresh operation has been performed for all the erase blocks, the process begins again with the first erase block.

The refresh operation can be performed 512 times, or the reading and programming operations can be repeated 512 times without continuously performing the writing operation 512 times. In this case, data needed to be stored outside a chip greatly decreases from 4096 bits to 8 bits. This reduces the number of latches of the external memory controller when the refresh control is executed by the memory controller. Furthermore, when the refresh control is executed by both the operating system and microprocessor, the refresh operation can be performed at high speed since registers in the microprocessor can be used for storing data.

If the refresh operation is performed for each erase block as described above, data which is gradually lost due to a drain disturbance, can be recovered. However, the effective erasing time is slightly increased when the refresh operation is performed along with an erasing operation. Assuming that the time for one programming operation is 10 μs, the time for the refresh operation is about 5.1 ms since the programming operation is performed 512 times. The conventional erasing time is about 100 ms and thus the effective erasing time is increased by only 5.1%.

An improvement in drain stress time is also achieved. When a word line is selected and a logical "0" is supplied to the word line, drain stress is applied. During programming, the total time of the drain stress is expressed by:

$$(2048-2) \times 10 \ \mu s$$

When this writing operation is repeated $10^5$ times (i.e., when data of the other block is written), the worst case for the drain stress and its total time is expressed by:

$$(2048-2) \times 10 \ \mu s \times 10^5 \ times \approx 2000 \ sec$$

If, however, memory cells of one block are refreshed whenever data of the block is erased, the total time of the drain stress is given by:

$$(2048-2) \times 10 \ \mu s \approx 20 \ ms$$

It is clear that the drain stress time is greatly reduced by performing the refresh operation.

Figure 6:
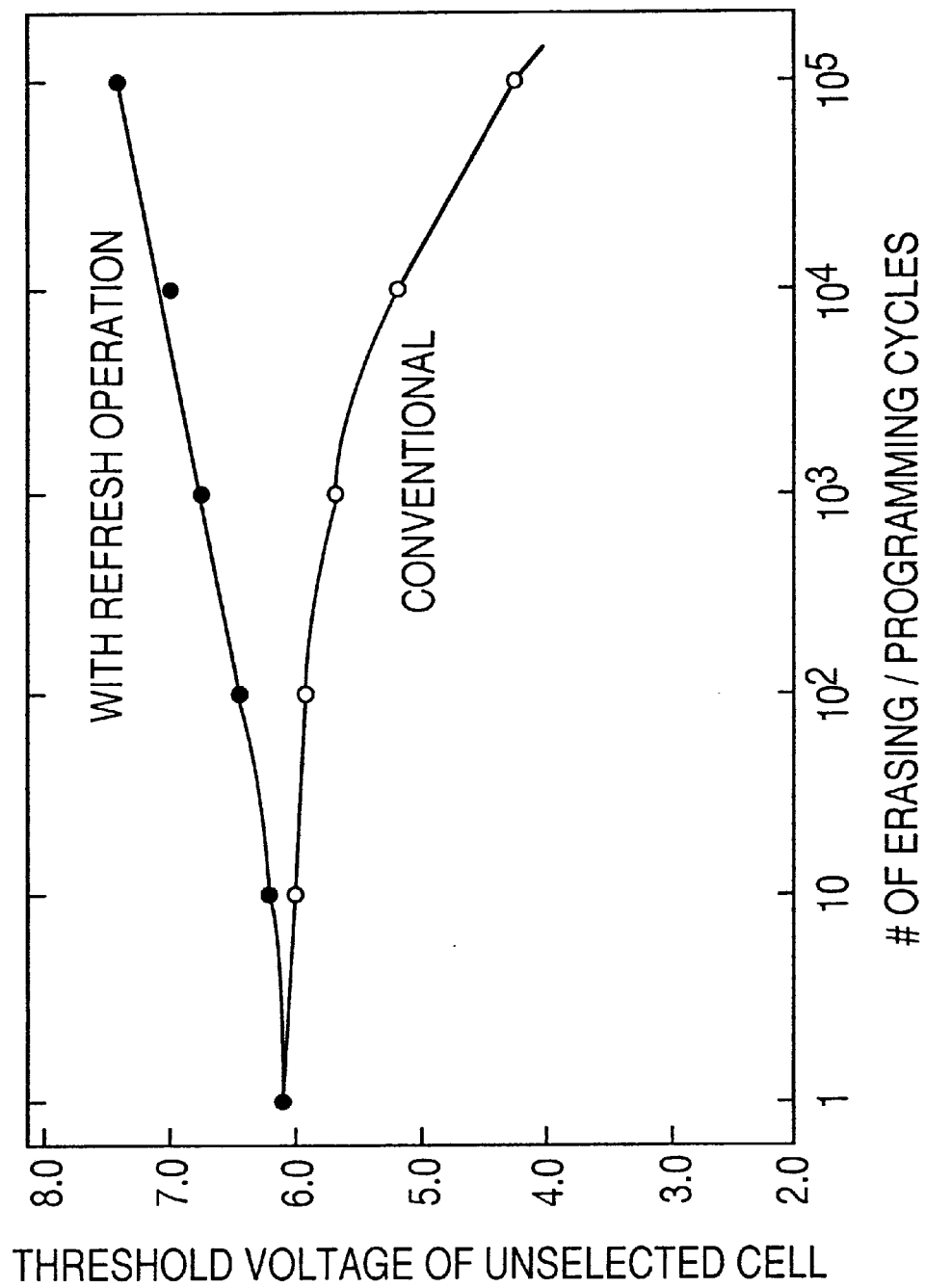
FIG. 6 is a graph of the threshold voltage of an unselected cell versus the number of programming/erasing cycles in both a conventional non-volatile memory device and a nonvolatile memory device wherein a refresh operation is performed on the unselected memory cells.

FIG. 6 shows a relationship between the lowest threshold voltage of non-selected word lines and the number of rewriting operations when specific word lines (2048-2) are selected and data is rewritten thereto. According to the prior art technique, the threshold voltage is decreased below 5V and data is inverted when the rewriting operation is performed about $2 \times 10^4$ times. With refresh, the threshold voltage is increased but no data is varied.

Consequently, the program efficiency is improved while, at the same time, the erasing speed remains the same. In the prior art technique, the drain-impurity concentration of memory cells is lowered in order to prevent data from being easily inverted by the drain stress. However, the lower drain impurity concentration degrades the programming efficiency. Further, in the prior art technique, the erasing speed is reduced if the impurity concentration is decreased near the drain region. Thus, the programming efficiency and erasing speed cannot be improved simultaneously in the prior art technique. However, in the above-described device, both the programming efficiency and the erasing speed can be improved since the resistance to drain disturbance is increased.

When a refresh operation such as that described above is performed by a nonvolatile semiconductor memory device, a block address of an erase block for which the next refresh operation is to be performed must be held. Such a block address may be held in an SRAM or the like, but this case does not contribute to the feature of the nonvolatile semiconductor memory device in which data is not erased even if power is cut off. In order to prevent block address data from being erased even if power is cut off, the address of a block for the refresh operation may be stored in a nonvolatile memory cell or the like. If, however, a binary counter is constituted by nonvolatile memory cells, the binary counter needs to be updated every refresh operation, and thus the nonvolatile memory cells of the binary counter will be subjected to frequent programming/erasing operations. If a refresh operation is performed whenever an erasing operation is performed for an arbitrary erase block, a stress which is several times as much as that applied to the erase block will be applied to the nonvolatile memory cells of the binary counter. As will be described below, in accordance with the present invention, if a non-volatile flag cell is used, an address for the next refresh operation can be stored even when power is cut off, and programming/erasing operations are not concentrated on a flag cell array if the flag cells are arranged so as to correspond to the refresh blocks.

Figure 7:
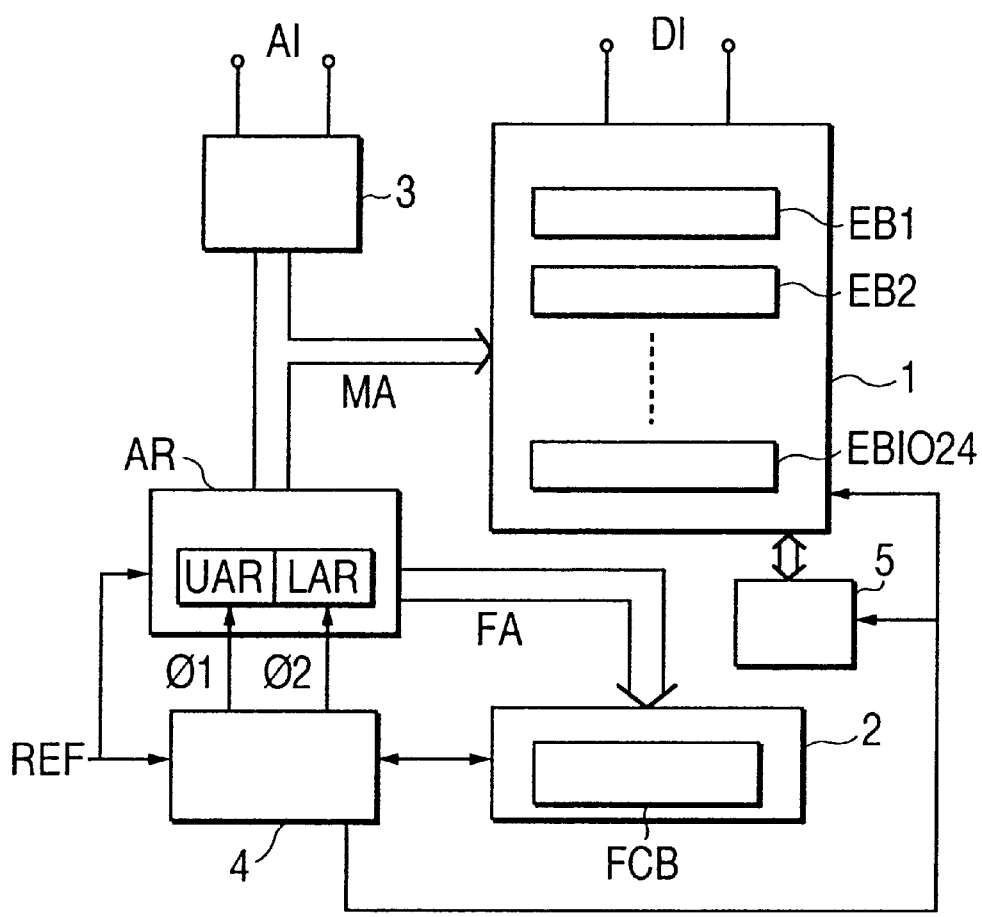
FIG. 7 is a block diagram of a nonvolatile semiconductor memory device according to a first embodiment of the present invention.

FIG. 7 is a block diagram of a nonvolatile semiconductor memory device according to a first embodiment of the present invention. This device comprises a 4-Mbit memory cell array 1, a flag cell array 2, an address buffer 3, a refresh control circuit 4, an 8-bit latch circuit 5, and an address register AR. The memory cell array 1 includes 1024 erase blocks EB. A particular one of the erase blocks EB is selected by the upper 10 bits of 19-bit address MA, and 8 memory cells of the block EB are selected by the lower 9 bits of the address MA. The memory cell array 1 also includes 1024 refresh blocks which correspond to the refresh blocks. The flag cell array 2 has 1024 nonvolatile flag cells which are numbered and correspond to the erase blocks. The address buffer 3 latches an externally supplied 19-bit address and generates an internal address MA therefrom. The latch circuit 5 temporarily stores data read from the memory cells in the memory cell array 1 under the control of refresh control circuit 4. The address register AR temporarily stores an address used for performing the refresh operation.

Figure 8A:
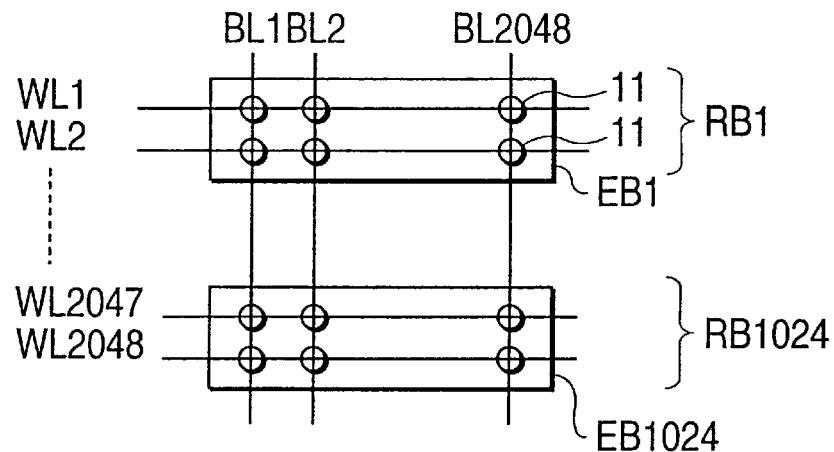
FIGS. 8(A), 8(B), and 8(C) are circuit diagrams of elements of the memory device of FIG. 7.

FIG. 8(a) is a detailed block diagram of memory cell array 1 of FIG. 7. Memory cell array 1 includes parallel word lines WL1, WL2, . . . , WL2047, and WL2048 extending in a first direction (horizontally in FIG. 8A) and parallel bit lines BL1, BL2, . . . , BL2048 extending in a second direction (vertically in FIG. 8A) so as to intersect the word lines. Memory cells 11 are arranged at the respective intersections of word lines WL and bit lines BL such that the memory cells 11 in a row of the memory cell array are coupled to the same one of the word lines and the memory cells 11 in a column of the memory cell array are coupled to same one of the bit lines. Memory cell array 1 is divided in erase blocks EB1, . . . EB1024 and corresponding refresh blocks RB1, . . . , RB1024. In the instant embodiment, each erase block and corresponding refresh block includes the memory cells 11 which are connected to two adjacent ones of word lines WL1, WL2, . . . , WL2047, and WL2048. Thus, EB1 and RB1 include the memory cells 11 connected to WL1 and WL2 and EB1024 and RB1024 include the memory cells 11 connected to WL2047 and WL2048. Word lines WL1, . . . , WL2048 are selected by a decoder (not shown) which decodes internal address MA.

Figure 8B:
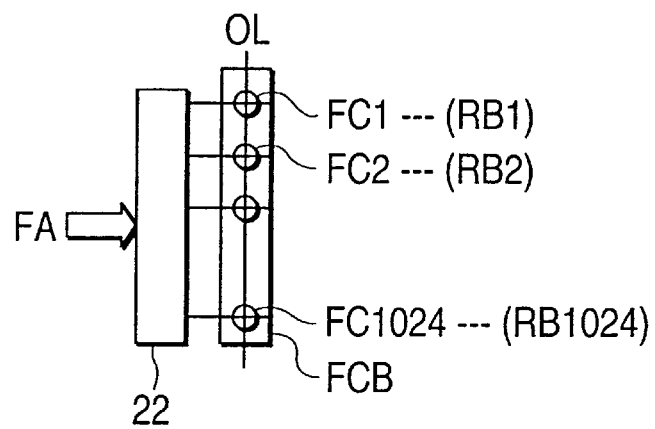

FIG. 8(b) is a detailed block diagram of flag cell array 2 of FIG. 7. Flag cell array 2 includes a flag cell block FCB having non-volatile flag cells FC1, FC2, . . . , FC1024. Each of the flag cells FC1, FC2, . . . , FC1024 is connected to an output line OL. Each flag cell FC corresponds to one of the refresh blocks RB. Thus, flag cell FC1 corresponds to refresh block RB1, flag cell FC2 corresponds to refresh block RB2, etc. A decoder 22 decodes a 10-bit flag address FA to select one of the flag cells FC.

Figure 8C:
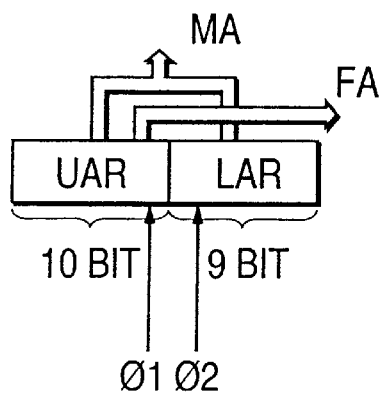

FIG. 8(c) is a detailed block diagram of address register AR of FIG. 7. Address register AR includes a 10-bit upper address register UAR and a 9-bit low address register LAR. Upper address register UAR and lower address register LAR constitute a 19-bit address register for generating an address MA. Upper address register UAR generates a flag address FA which is supplied to decoder 22 of the flag cell array (see FIG. 8(b)). Upper address register UAR is incremented by one in response to a signal φ1 and lower address register LAR is incremented by one in response to a signal φ2.

The operation of the semiconductor memory system including the flag cells will now be described. It will be assumed that a refresh operation has been completed for RB1, RB2, RB3, RB4, and RB5. Thus, the next refresh operation is to be performed for the sixth refresh block RB6. In this case, the flag cells FC1, FC2, FC3, FC4, and FC5, which respectively correspond to refresh blocks RB1–RB5, are in a programmed state and store logical "0" data and flag cells FC6, . . . , FC1024, which respectively correspond to refresh blocks RB6–RB1024, are in an erased state and store logical "1" data. As will be discussed in greater detail below, refresh control circuit 4 sequentially examines the data in the flag cells in order to determine which refresh block will be refreshed in the next refresh operation. More specifically, a reading operation begins at flag cell FC1. If logical "0" data is read out, data from the next flag cell is read out. This process continues until logical "1" data is read out from one of the flag cells. In the above-described situation, logical "1" data would be read out from flag cell FC6. When logical "1" data is read out from a flag cell, a refresh operation is performed for the refresh block corresponding to that flag cell. Thus, in the above-described situation, a refresh operation would be performed for refresh block RB6. In short, a refresh operation is performed for the refresh block which corresponds to the first flag cell which is found to store logical "1" data. After the refresh operation is performed for the refresh block, data is written to the corresponding flag cell so that the flag cell stores logical "0" data. Thus, in the above-described situation, data is written to flag cell FC6 whereby flag cell FC6 stored logical "0" data.

Figure 9:
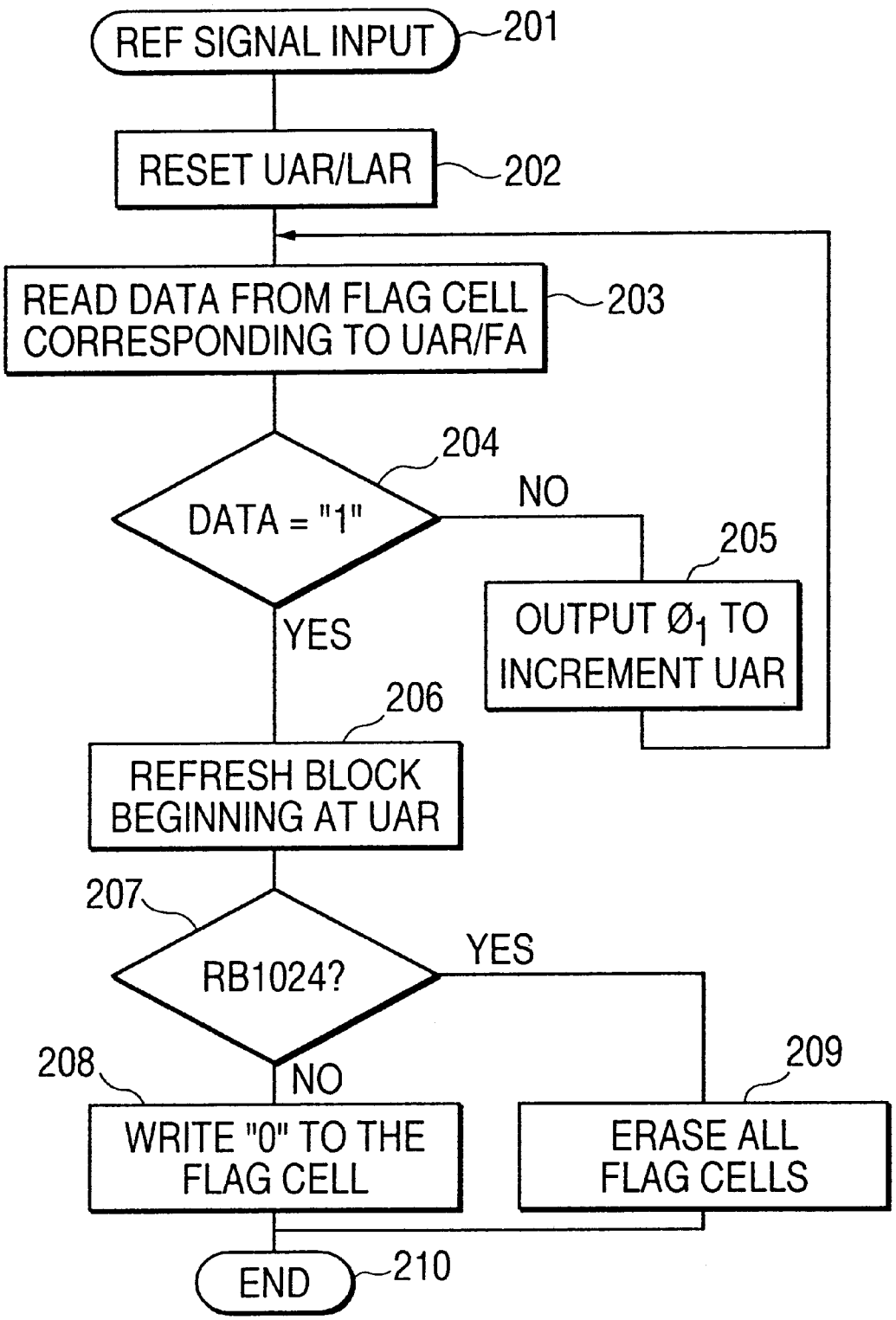
FIG. 9 is a flow chart of an operation of a refresh control circuit.

FIG. 9 is a flow chart illustrating the operation of refresh control circuit 4. When external refresh signal Ref is input (step 201), refresh control circuit 4 begins the refresh operation. Address registers UAR and LAR of address register AR are reset to address 0 (step 202). Then, the data of a flag cell corresponding to the flag address FA generated by upper address register UAR is read out (step 203) and it is determined whether the data is logical "1" data (step 204). If not, signal φ1 is output and the address register UAR is incremented by one (step 205) and control returns to step 203. If so, the refresh operation is performed (step 206). As described above, during refresh, data is read out and written back to the memory cells of the block being refreshed. Address register LAR is incremented in response to the signal φ2 and a refresh operation is performed in 8-bit groups using 8-bit latch circuit 5. Address register LAR is incremented from 000H to 1FFH. After the refresh operation, it is determined whether the flag address FA designates the flag cell FC1024 corresponding to the last refresh block RB1024 (step 207). If so, all of the flag cells are erased (step 209). If not, logical "0" data is written to the flag cell FC corresponding to the refresh block RB which has just been refreshed (step 208). The refresh operation is then complete (step 210). The operations set forth in the flow chart illustrated in FIG. 9 may be easily implemented by a sequencer.

Thus, refresh control circuit 4 sequentially reads data stored in the flag cells of flag cell array 2 beginning with flag cell FC1. Upon reaching a flag cell in the erased state, i.e., storing logical "1" data, refresh control circuit 4 performs a refresh operation for the refresh block RB corresponding to the flag cell storing the logical "1" data and programs the flag cell corresponding to the refreshed block to store logical "0" data. When the flag cell FC storing the logical "1" data corresponds to the last refresh block RB, an erasing operation is performed to erase the data stored in all of the flag cells FC. As a result, in the above-described embodiment, the flag cells are erased only after 1024 refresh operations. Therefore, the number of erasing operations to which the flag cells are subjected is almost equal to the average number of erasing operations to which the erase blocks are subjected. Thus, the flag cells are not subjected to a high number of programming/erasing operations like the nonvolatile memory cells of a refresh counter for keeping track of the next block to be refreshed.

While the circuits of the above-described embodiment may be mounted on a single chip, the invention is not limited in this respect. For example, the circuits may be formed separately on a plurality of chips or the memory cell array 1 and the flag cell array 2 may be formed on the same memory chip, whereby, for example, the flag cell array may constitute one erase block (e.g., EB1025).

Figure 10:
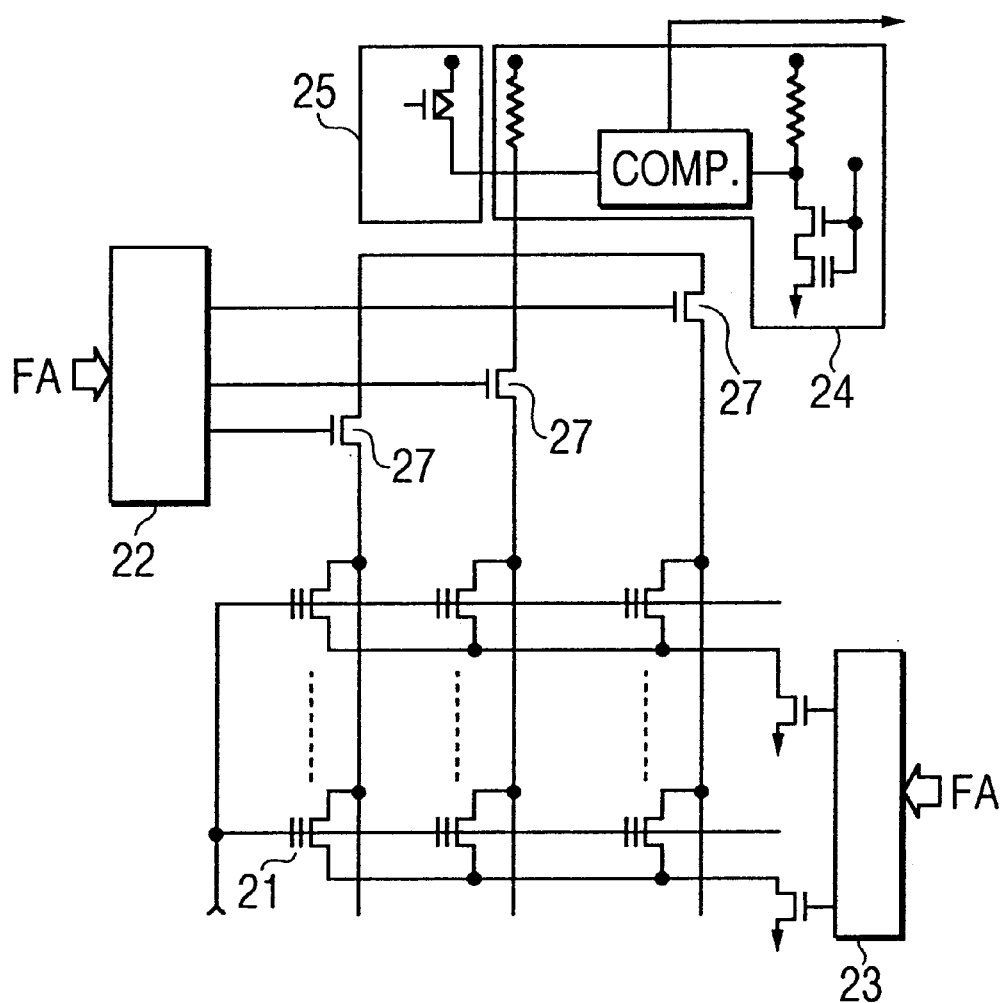
FIG. 10 is a circuit diagram of a modification to the flag cell array of FIG. 8(B) according to the first embodiment.

FIG. 10 illustrates a modification of the flag cell array of the above embodiment in which the flag cells are arranged in a matrix. The flag cell array of FIG. 10 is 32×32 row and column matrix which includes flag cells 21 such as MOS transistors each having a floating gate. The flag cell array further includes 5-bit to 32-bit decoders 22 and 23, a read circuit 24, and a write circuit 25. The output of decoder 22 controls column gates 27 to select columns of the matrix and the output of decoder 23 controls the source potentials of the MOS transistors to select rows of the matrix. In the reading and writing operations of the MOS transistors, a high-level voltage is applied to all the control gates of the MOS transistors, the source of a selected cell is grounded, and the drain thereof is connected to the read circuit 24 or the write circuit 25 through one of column gates 27. The erasing operation is performed simultaneously for all the flag cells.

Figure 11:
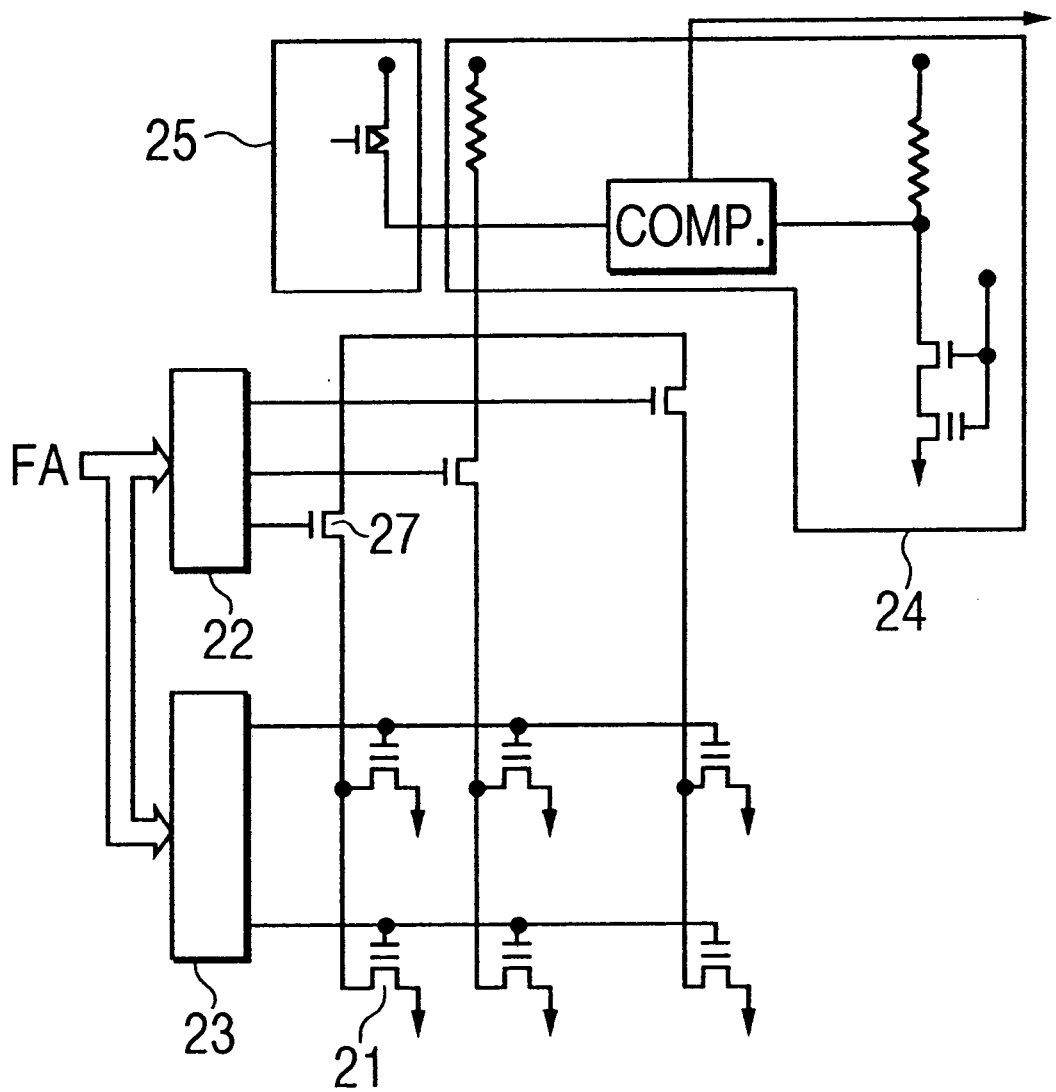
FIG. 11 is a circuit diagram of another modification to the flag cell array of FIG. 8(B) according to the first embodiment.

FIG. 11 illustrates another modification of the flag cell array in which the flag cells are arranged as in a conventional memory. Specifically, MOS transistors 21 each having a floating gate are arranged in 32×32 row and column matrix. In FIG. 11, the elements corresponding to the elements of FIG. 10 are designated by the same reference numerals and descriptions thereof are omitted.

Figure 12:
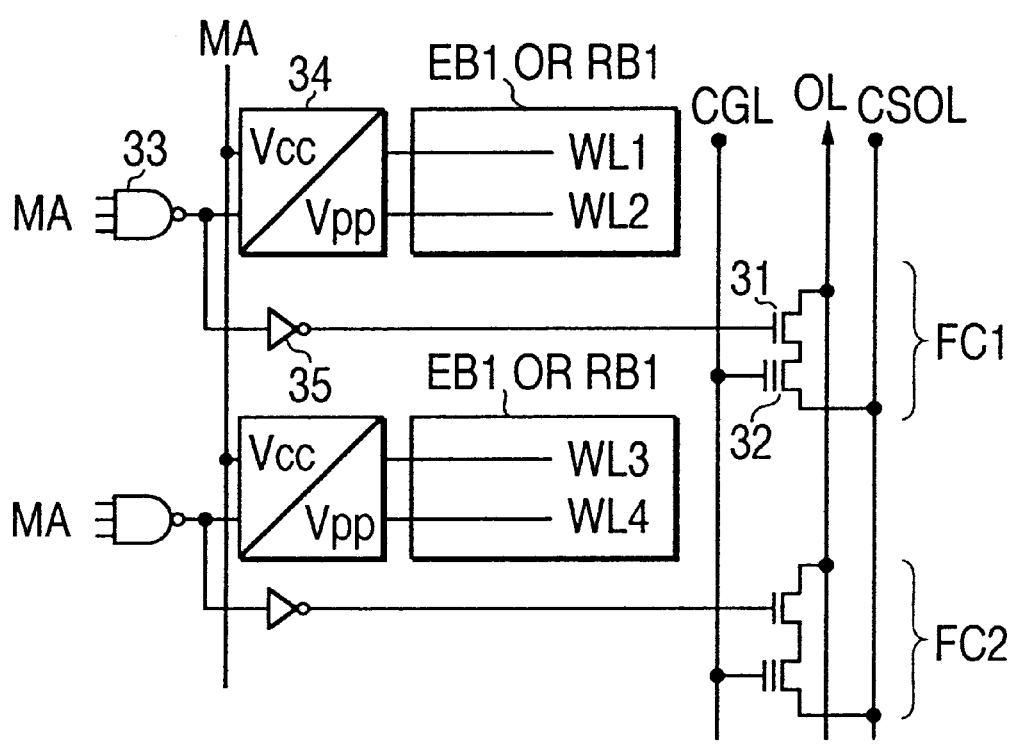
FIG. 12 is a circuit diagram of a modification to the decoder used for the memory cell array and the flag cell array according to the first embodiment.

FIG. 12 illustrates an arrangement in which the decoder for selecting a flag cell and the decoder for selecting a nonvolatile memory cell in memory cell array 1 are replaced by a single common decoder. The flag cell array of FIG. 12 is formed such that the flag cells FC are connected to one another via a single output line. Each flag cell includes a selecting transistor 31 and a floating gate-type transistor 32 connected in series. The control gates of the transistors 32 are connected in common to common gate line CGL. The common gate line is held high during the writing and reading operations. The sources of the transistors 32 are connected in common to a common source line CSOL. Common source line CSOL is held at a high potential during the erasing operation and held at a ground potential at times other than during the erasing operation. The drain of each transistor 32 is connected to a common output line OL through the corresponding selecting transistor 31. Common output line OL is connected to a read circuit (not shown) and a write circuit (not shown). The control gate of each selecting transistor 31 is supplied with an output a predecoder 33 through an inverter 35. The output of predecoder 33 is supplied to the word lines WL of the memory cell array 1 through a level shift circuit 34. This arrangement permits a reduction in chip area since only a single decoder is used.

FIG. 13 illustrates a second embodiment of the present invention in which the number of erase blocks and the number of refresh blocks of the memory cell array are not equal. In the arrangement of FIG. 13, the memory cell array is divided into erase blocks EB1, EB2, ..., EB1024 and refresh blocks RB1, ..., RB512. In the instant embodiment, each erase block includes the memory cells 11 which are connected to two adjacent ones of word lines WL1, WL2, ..., WL2047, and WL2048. Thus, EB1 includes the memory cells 11 connected to WL1 and WL2 and EB1024 includes the memory cells 11 connected to WL2047 and WL2048. Each refresh block RB includes two erase blocks. That is, for example, RB1 includes the memory cells 11 connected to WL1, WL2, WL3, and WL4. Since the number of refresh blocks is decreased, the number of memory cells included in a single refresh block and thus the time required for each refresh operation is increased. However, the number of refresh cycles is reduced and the number of flag cells is also reduced. Thus, flag cells FC1, FC2, ..., FC512 are used with the memory cell array of FIG. 13 and address register UAR is a 9-bit register and address register LAR is a 10-bit address register.

Figure 14:
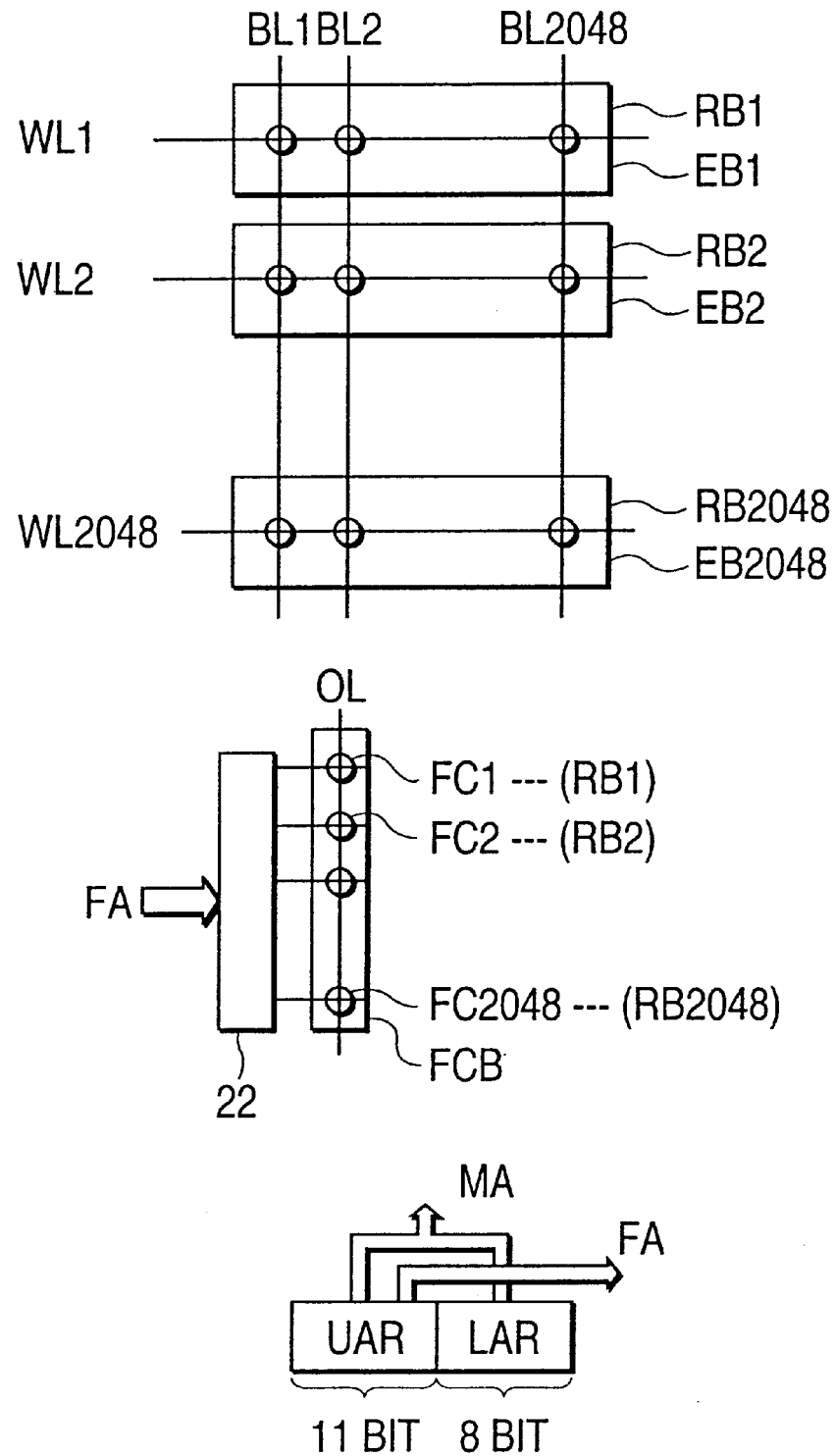
FIG. 14 is a circuit diagram of an arrangement of a nonvolatile semiconductor memory device according to a third embodiment of the present invention.

FIG. 14 illustrates a third embodiment of the present invention in which each erase block EB and each refresh block are formed by the memory cells connected to one word line. Specifically, FIG. 14 illustrates a memory cell array which is divided into erase blocks EB1, EB2, ..., EB2048 and refresh blocks RB1, RB2, ..., RB2048. In the instant embodiment, each erase block EB and each refresh block RB includes the memory cells which are connected to one of word lines WL1, WL2, ..., WL2048. Thus EB1 and RB1 includes the memory cells connected to WL1 and EB2048 and RB2048 includes the memory cells connected to WL2048. In this embodiment, flag cells FC1, FC2, ..., FC2048 are used and address register UAR is an 11-bit address register and address register LAR is an 8-bit address register.

FIG. 15 illustrates a fourth embodiment of the present invention in which each refresh block RB includes the memory cells which are connected to one of word lines WL1, WL2, ..., WL2048 and each erase block EB includes the memory cells which are connected to two adjacent ones of word lines WL1, WL2, ..., WL2047, and WL2048. Specifically, FIG. 15 illustrates a memory cell array which is divided into erase blocks EB1, ..., EB1024 and refresh blocks RB1, RB2, ..., RB2048. Thus RB1 includes the memory cells connected to word line WL1 and EB1 includes the memory cells connected to word lines WL1 and WL2. In this embodiment, flag cells FC1, ..., FC2048 are used and address register UAR is an 11-bit address register and address register LAR is an 8-bit address register.

Like the first embodiment, the second, third, fourth, and fifth embodiments prevent programming/erasing operations from being concentrated on the flag cells when refresh operations are implemented.

Figure 16:
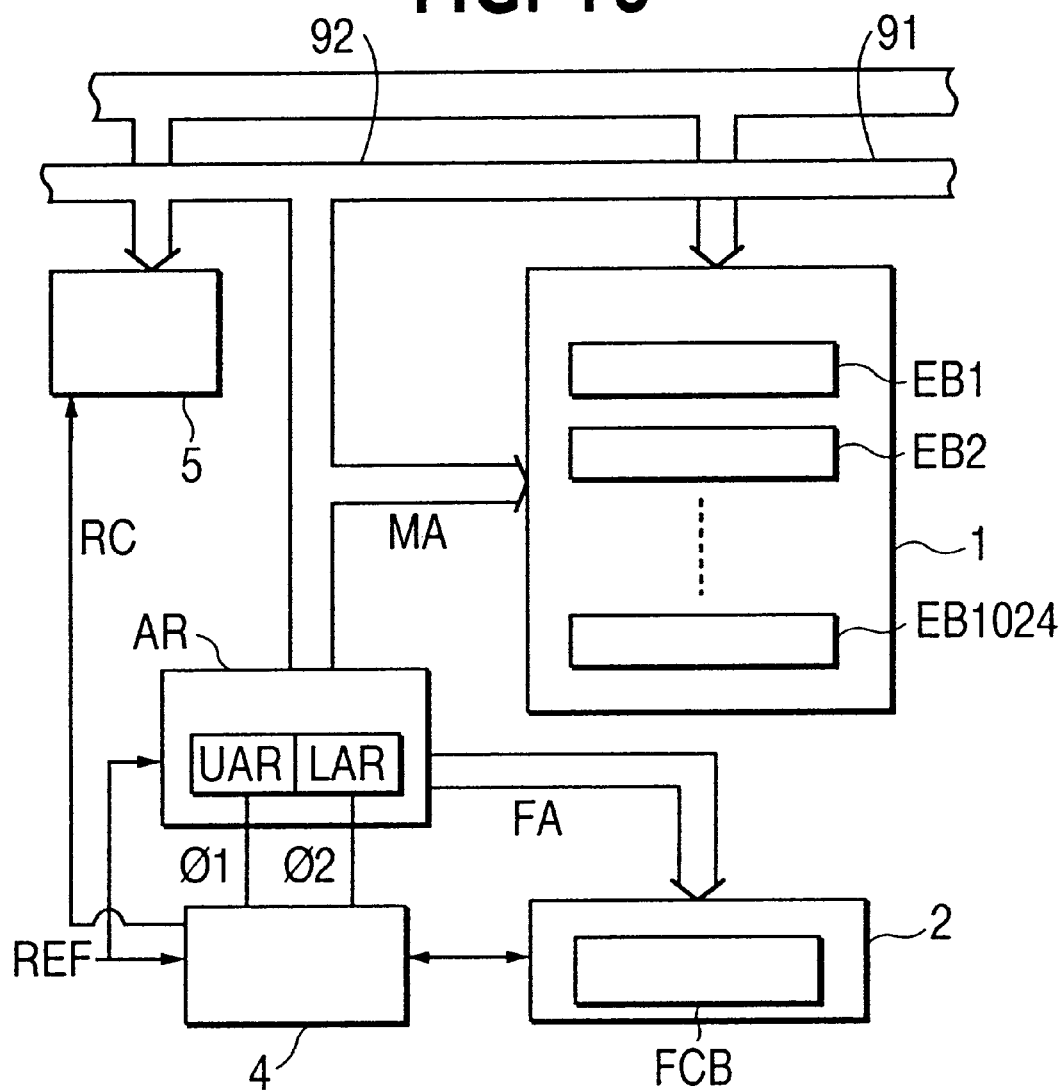
FIG. 16 is a circuit diagram of an arrangement of a nonvolatile semiconductor memory device according to a fifth embodiment of the present invention.

FIG. 16 is a block diagram illustrating a memory system in accordance with a fifth embodiment of the present invention. The memory system includes a 4-Mbit memory cell array 1, a flag cell array 2, a refresh control circuit 4, an 8-bit latch circuit 5, an address register AR, and a data bus 91 and address bus 92 both connected to an external central processing unit (not shown). Memory cell array 1 is divided into erase blocks EB1, EB2, ..., EB1024 and refresh blocks RB1, ..., RB1024. A particular one of erase blocks EB1, EB2, ..., EB1024 is selected in accordance with the upper 10 bits of a 19-bit address MA and 8 memory cells within the particular erase block are selected in accordance with the lower 9 bits of the address MA. Flag cell array 2 includes nonvolatile flag cells FC1, ..., FC1024 which respectively correspond to refresh blocks RB1, ..., RB1024. Refresh control circuit 4 performs the same operation as described above with respect to the first embodiment in response to a signal REF supplied by the external central processing unit. Latch circuit 5 temporarily stores data read from the memory cells of memory cell array 1 under the control of refresh control circuit 4. Address register AR temporarily stores an address used to perform the refresh operation.

In response to the signal REF supplied by the external central processing unit, the refresh control circuit 4 sequentially reads data stored in the flag cell array beginning with the first flag cell. Upon reaching a flag cell in the erased state, refresh control circuit 4 performs a writing operation such that the flag cell is changed from the erased state to a programmed state, and a refresh operation for writing the same data as the readout data to a nonvolatile memory cell of a refresh block corresponding to the flag cell is performed. When refresh control circuit 4 reads the data stored in the flag cell array beginning with the first flag cell and reaches the last flag cell, refresh control circuit 4 performs an erasing operation such that the data of all the flag cells is erased. As a result, an erasing operation for the flag cells is performed only after 1024 refresh operations. Therefore, the number of erasing operations for the flag cells is almost equal to the average number of erasing operations for the erase blocks, and any concentration of writing/erasing operations, which is a problem when a refresh counter is constituted by nonvolatile memory cells, does not occur.

The above-described fifth embodiment is directed to a memory system which can be divided into a plurality of chips, or in which a memory cell array 1 and a flag cell array 2 are formed by one memory chip, i.e. the flag cell array 2 can be formed as one erase block (e.g., EB1025). Further, refresh control circuit 4 can be part of the external central processing unit.

A nonvolatile semiconductor memory device having a resistance to the drain disturbance and the semiconductor memory system using this device have been described as the first to fifth embodiments. It is assumed in these embodiments that the cell capacity is 4-Mbits. However, the present invention is not limited in this respect, nor is it limited to a one-chip structure. Therefore, the semiconductor memory system can be realized by a semiconductor memory device including a plurality of chips, regardless of the cell capacity.

M flag cells corresponding to M refresh blocks are used in the above embodiments. However, the present invention is not limited in this respect. The object of the present invention can be attained provided M−1 or more flag cells are used. If M−1 flag cells are used, there is no flag cell corresponding to the last refresh block. The lack of a flag cell corresponding to the last refresh block can be compensated by detecting that all the M−1 flag cells are in the "0" state. If M+1 or more flag cells are used, an extra flag cell or cells can be used as a redundant cell or an auxiliary cell.

As described above, the present invention improves the resistance to drain disturbance and program efficiency of the nonvolatile memory system. The invention also provides a fast erasing memory device/system with memory cell transistors with the source region and the drain regions each having the same impurity concentration. And because the flag cells are nonvolatile memory cells, an address for the next refresh operation can be stored even though power is shut down. Furthermore, because the flag cells are arranged in correspondence with the refresh blocks, a concentration of programming/erasing operations on each of the flag cells is avoided, thereby limiting the effect of drain disturbance on the flag cell array.

We claim:

1. A nonvolatile semiconductor memory system comprising:
    a nonvolatile memory cell array including a plurality of nonvolatile memory cells arranged in matrix, said nonvolatile memory cell array being divided into refresh blocks;
    a flag cell array including a plurality of nonvolatile flag cells each of which corresponds to one of said refresh blocks and stores data representing refresh status of the corresponding refresh block.

2. A nonvolatile semiconductor memory system according to claim 1 wherein said data representing the refresh status of the corresponding refresh block is one of a first binary value representing that the corresponding refresh block has yet to be refreshed and a second binary value representing that the corresponding refresh block has been refreshed.

3. A nonvolatile semiconductor memory system according to claim 2 wherein said first binary value is an erased state and said second binary value is a programmed state.

4. A nonvolatile semiconductor memory system according to claim 1 further comprising:
    control means for scanning said flag cell array to determine a particular refresh block to which a refresh operation is to be conducted and for performing said refresh operation to said particular refresh block.

5. A nonvolatile semiconductor memory system according to claim 4 wherein said control means comprises:
    refresh control means for reading data from said flag cells of said flag cell array and for generating an increment signal;
    an address counter for holding a flag cell address that designates one of said flag cells of said flag cell array and for incrementing said flag cell address in response to said increment signal.

6. A nonvolatile semiconductor memory system according to claim 5 wherein said refresh control means reads data from each of said flag cells one flag cell at a time in a sequential manner.

7. A nonvolatile semiconductor memory system according to claim 5 wherein said refresh control means comprises:
    latch means for storing said data read from the designated one of said flag cells of said flag cell array; and
    means for comparing said data stored in said latch means to a predetermined value.

8. A nonvolatile semiconductor memory system according to claim 7 wherein said refresh control means comprises means for outputting said increment signal when said data stored in said latch means is not equal to said predetermined value.

9. A non-volatile semiconductor memory system according to claim 7 wherein said refresh operation is performed on a refresh block corresponding to the designated one of said flag cells when said data stored in said latch means is equal to said predetermined value.

10. A nonvolatile semiconductor memory system according to claim 7 wherein said refresh control means comprises means for determining whether said one of the designated flag cells is a last flag cell of the flag cell array.

11. A non-volatile semiconductor memory system according to claim 10 wherein the data of the designated one of said flag cells is changed when the designated one of said flag cells is determined not to be the last flag cell of the flag cell array.

12. A nonvolatile semiconductor memory system according to claim 5 wherein said address counter comprises:
    a first address counter for storing a refresh block address designating one of said refresh blocks; and
    a second address counter for storing a memory cell address designating one of said memory cells in said refresh blocks.

13. A nonvolatile semiconductor memory system according to claim 12 wherein said refresh block address is said flag cell address.

14. A non-volatile semiconductor memory system according to claim 6 wherein the data of all of the flag cells of the flag cell array is changed when the designated one of said flag cells is determined to be a last flag cell of the flag cell array.

15. A nonvolatile semiconductor memory system according to claim 1 wherein said flag cells are arranged in matrix of rows and columns and selected by a row decoder and a column decoder.

16. A nonvolatile semiconductor memory system according to claim 15 wherein source electrodes of each of the flag cells in a same row are commonly connected to said row decoder.

17. A nonvolatile semiconductor memory system according to claim 15 wherein control gate electrodes of all of said flag cells are commonly connected to a high potential.

18. A nonvolatile semiconductor memory system according to claim 15 further comprising column gate transistors connected to the drain electrodes of the flag cells in same column and having a control gate electrodes connected to said column decoder.

19. A nonvolatile semiconductor memory system according to claim 15 wherein source electrodes of all of said flag cells are commonly connected to a low potential.

20. A nonvolatile semiconductor memory system according to claim 15 wherein control gate electrodes of the flag cells in a same row are commonly connected to said row decoder.

21. A nonvolatile semiconductor memory system according to claim 15 further comprising column gate transistors connected to the drain electrodes of the flag cells in same column and having a control gate electrodes connected to said column decoder.

22. A nonvolatile semiconductor memory system according to claim 1 further comprising a decoder means for designating both one of said refresh blocks and one of said flag cells.

23. A nonvolatile semiconductor memory system according to claim 1 further comprising erase blocks.

24. A nonvolatile semiconductor memory system according to claim 23 wherein each of said erase blocks constitutes one of said refresh blocks.

25. A nonvolatile semiconductor memory system according to claim 23 wherein a plurality of erase blocks constitutes a refresh block.

26. A nonvolatile semiconductor memory system according to claim 23 wherein a plurality of refresh blocks constitutes an erase block.

27. A method of refreshing a nonvolatile semiconductor memory system having a nonvolatile memory cell array divided into a plurality of refresh blocks, said method comprising the steps of:

storing refresh status data in a non-volatile flag cell array;

selecting one of said plurality of refresh blocks according to said refresh status data stored in said non-volatile flag cell array; and refreshing data stored in each memory cell of said one refresh block.

28. The method of refreshing a nonvolatile semiconductor memory system according to claim 27 wherein said one of said plurality of refresh blocks is selected in a sequential manner for each successive refreshing operation.

29. The method of refreshing a nonvolatile semiconductor memory system according to claim 27 wherein said refreshing step comprises the steps of:

setting an address counter to an address corresponding a particular refresh block;

refreshing at least one memory cell designated by said address stored by said address counter; and incrementing said address counter.

30. A semiconductor memory device, comprising:

a memory cell array including memory cells located at intersections of bit lines and word lines, said memory cells being organized into a predetermined number of refresh blocks;

flag cells each storing refresh status data corresponding to a respective one of said refresh blocks; and a refresh control circuit for refreshing the contents of said memory cells in accordance with the refresh status data stored in said flag cells.

31. The semiconductor memory device according to claim 30, further comprising:

flag cell decoding circuitry for decoding flag cell address signals to select said flag cells.

32. The semiconductor memory device according to claim 31, wherein said flag cells are arranged in a row and column matrix and said flag cell decoding circuitry includes first and second decoders.

33. The semiconductor memory device according to claim 30, further comprising:

a single decoder for decoding address signals to select said word lines and said flag cells.

34. The semiconductor memory device according to claim 30, further comprising:

a row decoder for decoding memory cell address signals to select said word lines; and a flag cell decoder for decoding flag cell address signals to select said flag cells.

35. The semiconductor memory device according to claim 30, wherein each refresh block comprises the memory cells connected to two adjacent word lines.

36. The semiconductor memory device according to claim 30, wherein said memory cell array is further organized into a predetermined number of erase blocks.

37. The semiconductor memory device according to claim 36, wherein each erase block comprises the memory cells connected to two adjacent word lines.

38. The semiconductor memory device according to claim 36, wherein the predetermined number of refresh blocks is equal to the predetermined number of erase blocks.

39. The semiconductor memory device according to claim 36, wherein the predetermined number of refresh blocks is less than the predetermined number of erase blocks.

40. The semiconductor memory device according to claim 36, wherein the predetermined number of refresh blocks is greater than the predetermined number of erase blocks.

41. The semiconductor memory device according to claim 30, further comprising:

an address register including a first address register and a second address register, wherein said first address register and said second address register generate memory cell address signals for selecting said memory cells and said first address register generates flag cell address signals for selecting said flag cells.

42. The semiconductor memory device according to claim 30, wherein said flag cells store refresh status data having one of a first and a second logical level.

43. The semiconductor memory device according to claim 42, wherein said refresh control circuit sequentially reads the refresh status data of said flag cells such that (1) when said refresh control circuit reads the refresh status data of one of said flag cells having the first logical level, said refresh control circuit reads the refresh status data of the next flag cell in said flag cell sequence and (2) when said refresh control circuit reads the refresh status data of one of said flag cells having the second logical level, said refresh control circuit refreshes the contents of the memory cells of the corresponding refresh block and writes refresh status data of the first logical level to said one of said first flag cells.

44. The semiconductor memory device according to claim 43, wherein the first logical level corresponds to a programmed state and the second logical level corresponds to an erased state.

45. The semiconductor memory device according to claim 44, wherein said refresh control circuit erases the refresh status data stored in said flag cells after the contents of the memory cells corresponding to the last flag cell in said flag cell sequence have been refreshed.

46. The semiconductor memory device according to claim 39, wherein said flag cells each comprise MOS transistors having a floating gate.

47. The semiconductor memory device according to claim 30, wherein said memory cell array includes M refresh blocks and (M−1) flag cells, where M is an integer greater than or equal to one.

48. The semiconductor memory device according to claim 30, wherein said memory cell array includes M refresh blocks and M flag cells, where M is an integer greater than or equal to one.

* * * * *

UNITED STATES PATENT AND TRADEMARK OFFICE
CERTIFICATE OF CORRECTION

PATENT NO. : 6,160,738  
DATED : December 12, 2000  
INVENTOR(S) : Shigeru Atsumi et al.

Page 1 of 1

It is certified that error appears in the above-identified patent and that said Letters Patent is hereby corrected as shown below:

<u>Column 13, claim 21,</u>  
Line 25, -- a -- should be inserted before "same",  
Line 26, "a" should be deleted.

Signed and Sealed this

Nineteenth Day of February, 2002

Attest:

Attesting Officer

JAMES E. ROGAN  
*Director of the United States Patent and Trademark Office*